United States Patent [19]

Corzine et al.

[11] Patent Number: 4,901,039
[45] Date of Patent: Feb. 13, 1990

[54] COUPLED STRIP LINE CIRCUIT

[75] Inventors: Robert G. Corzine; Joseph A. Mosko, both of Ridgecrest, Calif.

[73] Assignee: The United States of America as represented by the Secretary of the Navy, Washington, D.C.

[21] Appl. No.: 320,449

[22] Filed: Mar. 6, 1989

[51] Int. Cl.$^4$ ............................................. H01P 5/00
[52] U.S. Cl. ...................... 333/1; 333/246; 333/260
[58] Field of Search .................. 333/1, 238, 246, 260; 361/412

[56] References Cited

U.S. PATENT DOCUMENTS

| | | | |
|---|---|---|---|
| 3,218,585 | 11/1965 | May | 333/246 |
| 3,221,286 | 11/1965 | Fedde . | |
| 3,303,439 | 2/1967 | Fulp | 333/246 |
| 3,384,842 | 5/1968 | Mattern et al. | 333/33 |
| 3,579,206 | 5/1971 | Grange . | |
| 3,806,767 | 4/1974 | Lehrfeld . | |
| 3,973,227 | 8/1976 | Erculiani . | |
| 4,528,530 | 7/1985 | Ketchen | 333/246 |

Primary Examiner—Paul Gensler
Attorney, Agent, or Firm—Sol Sheinbein; Melvin J. Sliwka; Harvey A. Gilbert

[57] ABSTRACT

A strip line circuit assembly consisting of a first and second strip line each comprised of three dielectric layers having conductor strips on either side of the center layer and ground planes on the outsides of the outer layers which sandwich the center layer except for an open central portion which turns through a 180° curved bend. The three layer first and second layer strip lines are separated by the single layer central portion and are sandwiched between three holding plates. The center holding plate has a curved end extension containing axially spaced channels which receive the conductors of the center dielectric layer on the inside of the end. One of the outer two holding plates is placed upon each of the outer dielectric layers in contact with the ground planes on the outer surfaces of each layer. A ground plane cover having spaced conductor channels corresponding to those in the center holding plate end extension is secured to the ends of the two outer holding plates about the bend to enclose the conductors on the outer surface of the center dielectric layer.

12 Claims, 2 Drawing Sheets

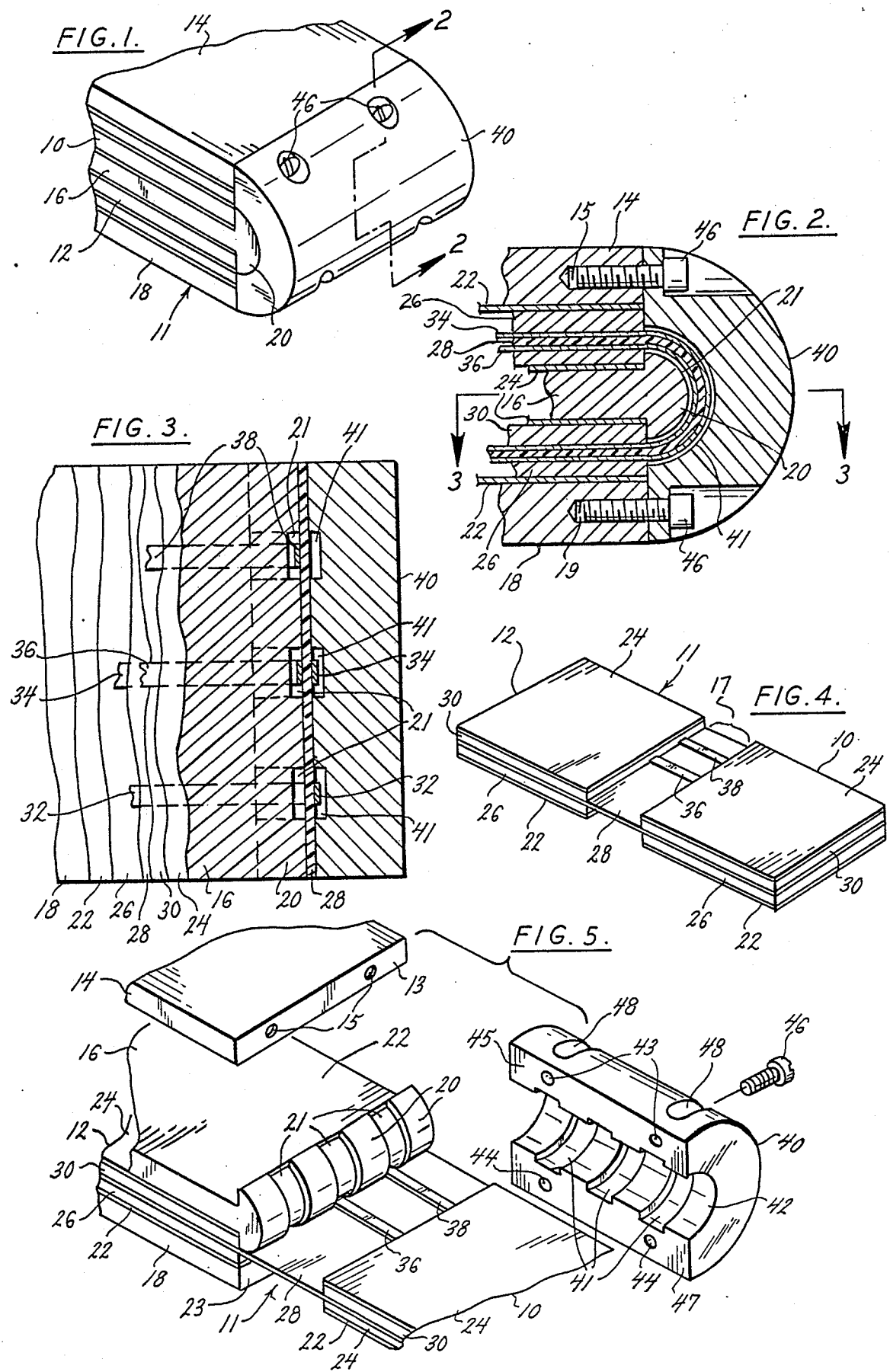

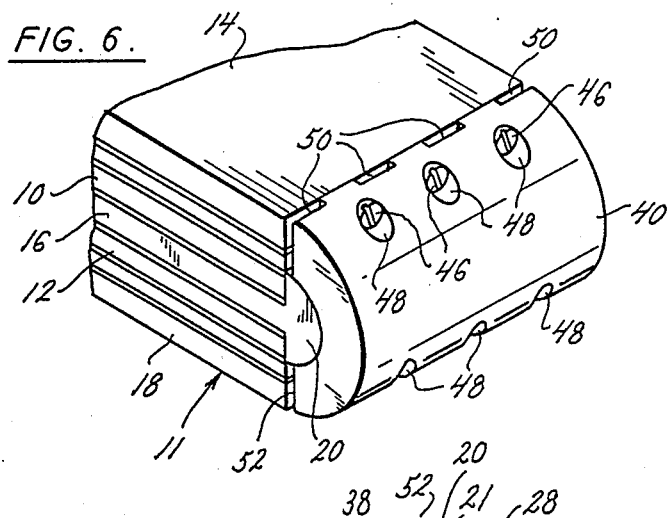
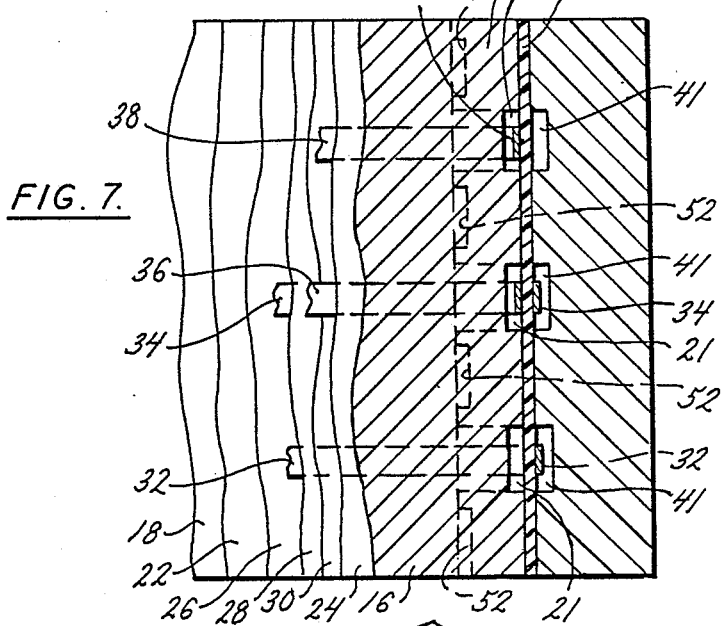
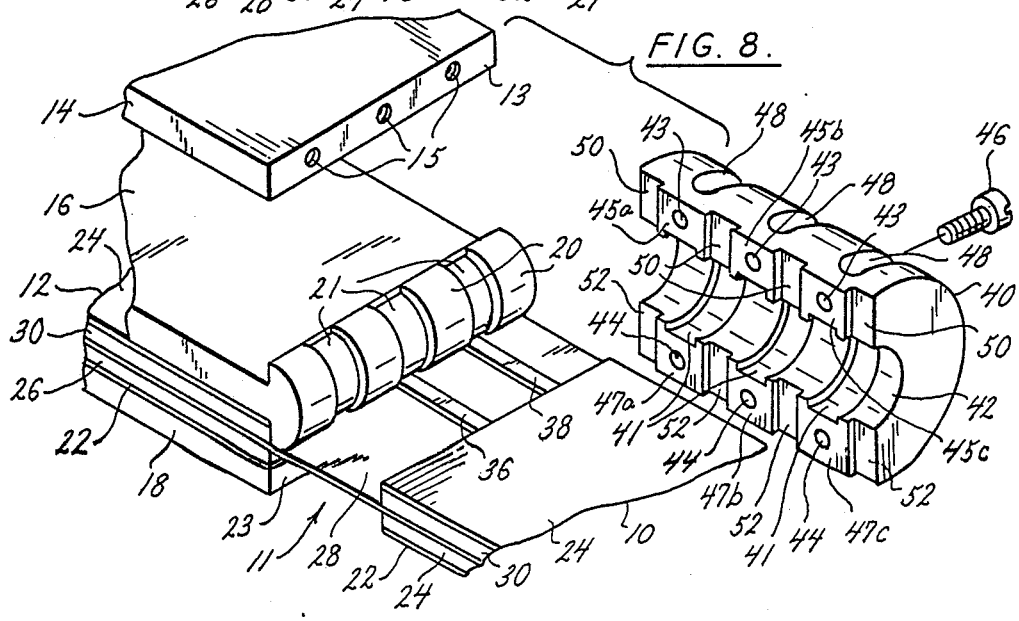

COUPLED STRIP LINE CIRCUIT

The present invention relates to a circuit apparatus and in particular to a folded circuit stack and the method of fabrication.

BACKGROUND AND SUMMARY OF THE INVENTION

A strip line circuit generally consists of three dielectric layers including a central layer having conductor strips on either side, and two outer layers having a ground plane on the outside of each such layer. Considerable problems are encountered when an attempt is made to fold a strip line circuit assembly so as to achieve a space savings or to provide a package that can be used with other circuit elements that require the strip line to be in the folded condition. Such applications, requiring the bending of a flexible circuit assembly, include but are not limited to strip line antennas with dual coupled circuits which are laid out on the same multi-layer, flexible circuit board. A considerable amount of trouble has been experienced in fabricating such an antenna. The favored approach to date has been to etch the circuitry on a single multi-layer circuit board and to fold it along with the ground planes, back on itself through a curved one hundred-eighty degree bend to form two layers. To ease the problems associated with folding the strip line sandwich outer boards, which are normally thicker then the center board, three boards having a total thickness the same as one of the outer boards has been substituted for each of the outer boards. Thus, the total strip line sandwich is composed of seven boards. This has proven to be complex to assemble and performance, in general, has been found to be degraded, particularly where such performance is a function of the thickness of each of the layers of the board.

It is thus an object of the present invention to provide a multi-layer, flexible, and continuous strip line circuit assembly that can be folded back upon itself through a curved bend of one hundred-eighty degrees.

It is yet another object of the present invention to provide a reliable connection coupling two stacked strip line circuits.

It is further an object of the present invention to provide a method of fabricating the stacked strip line circuit assembly from a flexible, multi-layer, continuous strip line circuit by coupling through a one-hundred-eighty degree bend of the center layer bearing the circuit conductors.

Whether the need for a stacked, coupled, strip line circuit derives from an electronic applications requirement or a functionally related or unrelated packaging requirement, the present invention has been found to be most satisfactory as a solution. Essentially the invention consists of two stacked, coplanar strip line circuits coupled physically and functionally by a 180° fold of only the center dielectric layer and the conductor leads on either side of that layer. The two other dielectric layers and the ground planes of each of the strip line circuits on the central dielectric layer are terminated, allowing the central dielectric layer to be bent around a curved support. The two strip line circuits are fabricated as one continuous planar central dielectric circuit upon which the two outer dielectric layers are impressed except for leaving open the central dielectric layer which is to be folded. Thus only a single layer of a multiple layer dielectric assembly needs to be folded to couple two stacked strip line circuits. The resulting circuit assembly is more reliable then previous folded circuits since there are no problems in terms of cracked dielectric boards, circuit traces, or ground planes. Further, performance is not degraded and, in effect, in many cases is improved, because there is no need to increase the thickness of the outer dielectric layers or the sandwiching of such layers.

In the specific case of antenna applications, the present invention has been found easy to assemble to an orthogonal balun connection to a spiral antenna.

These and other objects, features, and advantages of the present invention will be better understood with reference to the following discussion and the drawings which accompany it.

DESCRIPTIONS OF THE DRAWINGS

In the drawings which follows:

FIG. 1 is a perspective view of the invention.

FIG. 2 is a sectional view of the assembled invention taken along line 2—2 in FIG. 1.

FIG. 3 is a sectional view of the assembled invention taken along line 3—3 in FIG. 2.

FIG. 4 is a perspective view of the stripline circuit board assembly of the present invention prior to folding.

FIG. 5 is an exploded view of the present invention.

FIG. 6 is a perspective view of the invention with the ground plane cover having spaced top and bottom end surfaces.

FIG. 7 is a sectional view of the assembled invention taken along line 3—3 in FIG. 2 showing the spaced bottom end surfaces of the ground plane cover.

FIG. 8 is an exploded view of the present invention having the ground plane cover with spaced top and bottom end surfaces.

DETAILED DESCRIPTION OF THE PREFERRED EMBODIMENT

With reference to FIG. 1, the strip line assembly 11 is shown consisting of the stacked arrangement of the first strip line 10 and the second strip line 12 which are folded about the center holding plate 16 and are shown sandwiched between the first holding plate 14 and the third holding plate 18. The ground planes 22 shown in FIG. 2 which are fixed to the outer surface of the first dielectric layer 26 of the first strip line 10 and the second strip line 12 are seen in FIG. 2 in sandwiched relation between first dielectric layer 26 and the first holding plate 14 and the third holding plate 18. The ground plane cover 40 encloses the ground plane extension 20 of the center holding plate 16 and is secured to the first holding plate 14 by means of the bolts 46 in the threaded holes 15, and secured to the third holding plate 18 by the bolts 46 in the threaded holes 19, as shown in FIG. 2.

The alternating conductive and dielectric layers in the stacked stripline assembly 11 are revealed in FIGS. 2 and 3. Thus ground plane 22 on the outer surface of the first dielectric layer 26 contacts the inner surface of both the first holding plate 14 and the third holding plate 18 on opposite sides of the second (center) holding plate 16. The conductor strips 34 and 36 on opposite surfaces of the second dielectric layer 28 are in contact with the first and third dielectric layers 26 and 30, respectively in first and second stripline layers 10 and 12, observable clearly in FIG. 3. The ground planes 24 on the surfaces of the third dielectric layer 30 opposite the surfaces in contact with the conductor strips 36 and 38 are in contact with the opposite surfaces of center holding plate 16.

The strip line assembly 11 as it is fabricated with the first strip line 10 and the second strip line 12 separated by the central bend area 17 is shown in FIG. 4. The first strip line 10 consists of the second and center dielectric layer 28 sandwiched between the first dielectric layer 26 and the third dielectric layer 30. The ground plane 24 is shown on the upper surface of the third dielectric layer 30 of the first strip line 10. The ground plane 22 is shown attached to the lower surface of the first dielectric layer 26. In a similar fashion the second strip line 12 consists of the center dielectric layer 28 sandwiched between the first dielectric layer 26 and the third dielectric layer 30 on the opposite side of the central bend area 17 from the connecting first strip line 10. The second strip line 12 also has a ground plane 24 on the upper or top surface of the third dielectric layer 30. As in the case of first stripline 10, the ground plane 22 is shown attached to the lower surface of the first dielectric layer 26. It is obvious from FIGS. 2, 4 and 5 that the second or center dielectric layer 28 is the only dielectric layer extending through the central bend area 17 between first strip line 10 and second strip line 12. Also clearly shown in FIG. 4 are the conductor strips 36 and 38 which continue through the central bend area 17 between the first strip line 10 and the second strip line 12 on both sides of the second or center dielectric layer 28.

The strip line assembly 11 is shown in folded condition in FIG. 2. It should be obvious that the flexible material used for center dielectric layer 28 permits a variety of curvatures for the central bend area 17. In the present invention it has been found most desirable to have the bend curvature in the form of a semi-circle as the first strip line 10 and second strip line 12 are folded back upon each other for a one hundred-eighty degree turn around.

During the fabrication of the strip line assembly 11 as the first strip line 10 and second strip line 12 are folded, as shown in FIG. 2, the second or center holding plate 16 is inserted between the first strip line 10 and the second strip line 12 with the ground plane extension 20 of the holding plate 16 in contact with the upper surface of the second dielectric layer 28 in the central bend area 17, and specifically centered within the central bend area 17, so that, as the folding is completed, the center holding plate 16 is sandwiched between the first and second strip lines 10 and 12, respectively. As can be seen with reference to FIG. 5, the ground plane extension 20 of the central holding plate 16 contains axially separated conductor channels 21 for the purpose of accommodating the conductor strips 36 and 38 on the bottom side of the central, bend area 17 when the bending is completed.

The conductor strips 36 and 38 are thus maintained in the air dielectric within each of the conductor channels 21 of the ground plane extension 20. In the next stage of fabrication of strip line assembly 11 the first holding plate 14 is placed upon the ground plane 22 on the surface of the first dielectric layer 26 of the first strip line 10 within the stack. Similarly, the third holding plate 18 is placed against the ground plane 22 on the surface of the first dielectric layer 26 of the second strip line 12.

Thus, as seen in FIG. 5, the entire strip line assembly 11 comprised of the first strip line 10 and second strip line 12 in the folded condition about the second or center holding plate 16 is sandwiched between the first holding plate 14 and third holding plate 18. The strip line assembly 11 is completed upon the addition of the ground plane cover 40 about the end of the stacked strip line assembly 11 so that the ground plane cover 40 encloses the end extension 20 of the second or center holding plate 16. The ground plane cover 40 contains a curved interior interrupted surface 42 which contains the axially spaced conductor channels 41 which will receive the conductor strips 32 and 34 on the outer or top side of the central bend area 17 when the ground plane cover 40 is affixed rigidly to the end surfaces 13 and 23 of the first holding plate 14 and third holding plate 18, respectively, immediately adjacent to the bend of the strip line assembly 11. The mating surfaces 13 and 45, and 23 and 47 must be flat so that their contact is total and without fault in order to assure maximum continuity and minimum impedance. Bolt holes are one means that has been used to attach the ground plane cover 40 to the first holding plate 14 and second holding plate 18. As can be seen in FIGS. 2 and 5, the threaded holes 15 and 19 in the holding plate 14 and the holding plate 18, respectively, are located to receive bolts 46 inserted by way of the grooves 48 through the holes 43 and 44 in the mating surfaces of the ground plane cover 40. The axially spaced conductor channels 41 are shown in the interior curved surface of the ground plane cover 40 in FIG. 5. When the ground plane cover 40 is affixed to the first holding plate 14 and third holding plate 18, the conductor strips 32 and 34 of the strip line circuit 13 within the central bend area 17 are caused to be received within conductor channels 41 so that they are maintained within the air dielectric provided by those conductor channels. By setting the width of the channels 21 and 41 to slightly exceed the width of the stripline conductors 32, 34, 36 and 38 the stripline conductor width can be made the same in the bend area as in the first and second striplines 10 and 12, respectively. It is only necessary that the strips be centered in the channels.

The conductor strips 32 and 34 which are received within the conductor channels 41 of the ground plane cover 40 and the conductor strips 36 and 38 which are received and maintained within the air dielectric of the conductor channels 21 of the ground plane extension 20 of the center holding plate 16 are shown in FIG. 3. Thus, assembled, the strip line assembly 11 is ready for electrical connection to other circuits required by specific applications.

Where flatness of the mating end surface 13 of first holding plate 14 and top end surface 45 of ground plane cover 40 or end surface 23 of third holding plate 18 and bottom end surface 47 of ground plane cover 40 is a problem, physical and electrical contact and continuity will be jeopardized. Depending upon the application, the resultant effect on impedance may be unacceptable. The embodiment of the invention depicted in FIGS. 6, 7, and 8 provides efficient contact of the mating surfaces with maximum continuity. This embodiment permits secure enclosure of conductor strips 32 and 34 within the conductor channels 41 of the ground plane cover 40 and the conductor strips 36 and 38 within the conductor channels 21 of the ground plane extension 20. In this embodiment the top end surface 45 of the ground plane cover 40 consists of spaced top end surfaces 45a, 45b, and 45c separated from each other by the recesses 50. Likewise, the bottom end surface 47 of the ground plane cover 40 consists of the spaced bottom end surfaces 47a, 47b, and 47c separated from each other by the recesses 52. All are sized and configured, as shown in FIG. 8, to extend beyond and about the channels 41 in the ground plane cover 40. It should be noted from FIGS. 6, 7, and 8 that the spaced top and bottom end surfaces are individually planar and, further, they are coplanar as a group. Configurations other than planar or coplanar may be used to accommodate specific applications as long as physical and electrical continuity is maintained adequately to minimize signal leakage and impedance. Bolt holes 43 and 44 extend from the central area of each of the spaced top and bottom end surfaces through the ground plane cover 40 and out the adjoining grooves 48. As shown, the number of spaced top or bottom end surfaces is consistent with the number of conductor channels 41 in the ground plane cover 40. When the ground plane cover 40 is juxtaposed with the end surface 13 of the first holding plate 14 and the end surface 23 of the third holding plate 18, the intimate contact between the spaced top and bottom end surfaces with the first and third holding plate end surfaces is secured by means of the bolts 46 extending through the grooves 48 and the adjoining holes 43 and into threaded relationship with the threaded holes 15 of the holding plates. By thus interrupting the top and bottom end surfaces of the ground plane cover 40 with spaced end surfaces 45a, 45b, 45c and 47a, 47b and 47c, respectively, physical and electrical discontinuities associated with surface irregularities of continuous, i.e. uninterrupted, mating surfaces are eliminated. The conductor strips 32 and 34 are securely contained in the channels 41 and undegraded circuit performance maintained.

Although the present invention has been described with some degree of particularity, it should be obvious to those skilled in the art that a variety of material selections and sandwiching combinations are possible for various types of applications requiring assembly of a strip line circuit or circuits so that stacking may be accomplished in a reliable and efficient manner. Variations in material and structural arrangements to address these various applications should clearly follow in light of the description provided herein and are intended to be encompassed in the claims that follow.

What we now claim is:

1. A strip line assembly having two stacked strip lines, each said strip line having a second dielectric layer with conductor leads etched in either side thereof, and first and third dielectric layers sandwiching said second dielectric layer and having ground planes etched on their outer surfaces, comprising:
    a center holding plate sandwiched between said two stacked strip lines and having a curved, ground plane extension extending beyond said stacked strip lines, with conductor channels disposed therein;
    first and third holding plates sandwiching said stacked strip lines, each of said plates having an end surface on its end adjacent to said ground plane extension of said center holding plate;
    an extension of said second dielectric layer comprising a central bend area between the adjoining ends of said layer in each of said stacked, strip lines, said extension juxtaposed upon and about said curved ground plane extension; and
    a ground plane cover for enclosing said second dielectric layer extension upon said curved ground plane extension, said cover having a top and bottom end surface for mating contact with the facing end surface of each of said outer holding plates.

2. The strip line assembly of claim 1 wherein said second dielectric layer curves 180° around said curved ground plane extension.

3. The strip line assembly of claim 2 wherein said conductor channels in said curved ground plane extension are separated axially.

4. The strip line assembly of claim 3 wherein said ground plane cover for enclosing said second dielectric layer extension upon said curved ground plane extension includes an internal curved surface having conductor channels separated axially therein.

5. The strip line assembly of claim 4 wherein said 180° curved bend is semi-circular.

6. The strip line assembly of claim 5 wherein said ground plane cover for enclosing said second dielectric layer extension upon said curved groundplane extension has flat, planar top and bottom end surfaces and said first and third holding plates have flat, planar end surfaces disposed to mate with the respective top and bottom end surfaces of said ground plane cover.

7. The strip line assembly of claim 6 wherein said top and bottom end surfaces of said ground plane cover are each comprised of a series of spaced surfaces, each of which spaced surfaces extends beyond an underlying conductor channel in said ground plane cover.

8. The strip line assembly of claim 7 wherein said top and bottom end surfaces are coplanar.

9. A strip line apparatus, comprising;
    a coplanar, strip line having a central dielectric layer with conductors etched in either side thereof, said strip line folded through a 180° bend of said central dielectric layer, and having two pairs of outer sandwiching dielectric layers with ground planes etched on the outer surfaces thereof, one pair of said outer layers extending from each end of said strip line opposite said bend to the point at which said bend begins;
    a coplanar center holding plate sandwiched between the folded ends of said strip line, said plate having a curved ground plane extension at one end facing said bend, said extension having a plurality of axially separated conductor channels disposed therein and receiving said second dielectric layer conductors facing inward from said bend;
    a pair of outer holding plates sandwiching said folded strip line coextensive with said outer dielectric layers, the end of each said plate facing said bend having one side of an attachment; and
    a means for enclosing said bend, said means having a curved interior surface having a plurality of axially separated conductor channels disposed therein and receiving said central layer conductors facing outward from said bend and having the mating side of said attachment for fixed engagement with said outer holding plates.

10. The strip line apparatus of claim 9 wherein said mating side of said attachment for fixed engagement with said outer holding plates comprises a pair of separated, coplanar spaced surfaces.

11. A method for fabricating a folded strip line having a lateral centerline, comprising:
    folding a coplanar strip line, having a center dielectric layer with conductors etched in either side thereof and a pair of outer sandwiching dielectric layers extending between the opposite ends of said strip line and a point equidistant from and on each side of said lateral centerline, sandwiching a center holding plate having a curved extension containing conductor channels, juxtaposing said central dielectric layer with said extension, and disposing said conductors on the inside of said bend in said extension channels;

sandwiching said strip line folded about said center holding plate between two planar outer holding plates having connection means in their respective ends proximate to said strip line bend; and rigidly enclosing said strip line bend with a ground plane cover having a mating curved interior surface with channels overlaying juxtaposed conductors on the outside of said bend.

12. A method for fabricating a coupled, stacked strip line from a coplanar, strip line having a lateral centerline comprising:

positioning a center holding plate having a curved ground plane extension at one end, relative to a coplanar, strip line such that the longitudinal centerlines of said plate and said strip line coincide, said extension having conductor channels disposed therein, and said strip line having a center dielectric layer with conductors etched in either side thereof and a pair of outer sandwiching dielectric layers extending between the opposite ends of said strip line and a point equidistant from and on each side of said lateral centerline;

folding said coplanar, strip line through a curved bend about said lateral centerline, said center dielectric disposed in juxtaposition with said curved extension, said conductors on the side of said center dielectric layer facing said curved extension disposed in said conductor channels;

sandwiching said strip line folded about said center holding plate between two planar outer holding plates having connection means in their respective ends proximate to said strip line bend;

enclosing said strip line bend with a ground plane cover having a curved interior surface with conductor channels disposed therein, said channels receiving said conductors on the side of said center dielectric layer facing said cover, said cover having separated, coplanar walls extending diametrically on opposite sides of the opening of and normal to said curved interior surface, said walls having connection means for mating with the juxtaposed connection means in the respective ends of said planar outer holding plates; and rigidly engaging said juxtaposed connection means in said ground plane cover and the ends of said planar outer holding plates.

* * * * *